United States Patent
Moriya et al.

(10) Patent No.: US 7,973,610 B2
(45) Date of Patent: Jul. 5, 2011

(54) SURFACE MOUNT CRYSTAL OSCILLATOR

(75) Inventors: Kouichi Moriya, Saitama (JP); Kenichi Sugawara, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 12/590,549

(22) Filed: Nov. 10, 2009

(65) Prior Publication Data

US 2010/0117746 A1 May 13, 2010

(30) Foreign Application Priority Data

Nov. 13, 2008 (JP) .................... 2008-290782
Oct. 7, 2009 (JP) .................... 2009-233088

(51) Int. Cl.
*H03B 1/00* (2006.01)

(52) U.S. Cl. ...... 331/68; 331/108 D; 331/158; 310/348; 310/352; 310/353

(58) Field of Classification Search ............ 331/68, 331/108 D, 158; 310/348, 352, 353
See application file for complete search history.

(56) References Cited

U.S. PATENT DOCUMENTS

| 6,445,254 B1* | 9/2002 | Shibuya et al. ............ 331/68 |
| 2002/0185939 A1* | 12/2002 | Aratake et al. ............ 310/348 |
| 2008/0068102 A1* | 3/2008 | Moriya et al. ............ 331/68 |

FOREIGN PATENT DOCUMENTS

| JP | H09-83248 | 3/1997 |
| JP | 2006-13650 | 1/2006 |

* cited by examiner

*Primary Examiner* — Joseph Chang
*Assistant Examiner* — Jeffrey Shin
(74) *Attorney, Agent, or Firm* — Scott D. Wofsy; Edwards Angell Palmer & Dodge LLP

(57) ABSTRACT

An object of the invention is to provide a surface mount type crystal oscillator in which a probe can be easily brought into contact with a crystal inspection terminal. The surface mount type crystal oscillator is such that a crystal piece and an IC chip are housed within a container main body having a bottom wall and frame wall formed with laminated ceramics, and a communication terminal is provided on an outer side surface of the container main body. The communication terminal is provided so as to span from the outer side surface of the bottom wall to the outer bottom surface of the outer wall, the communication terminal is made the crystal inspection terminal, and the crystal piece and the IC chip are arranged in parallel on the inner bottom surface within the container main body.

2 Claims, 5 Drawing Sheets

US 7,973,610 B2

SURFACE MOUNT CRYSTAL OSCILLATOR

BACKGROUND OF THE INVENTION

1. Technical Field

The present invention relates to a surface mount type crystal oscillator (hereunder, referred to as a "surface mount oscillator"), and in particular, to a communication terminal (such as a crystal inspection terminal and a writing terminal) of a surface mount oscillator with reduced height.

2. Background of the Invention

A surface mount oscillator, because of its small size and light weight, is used particularly in portable electronic devices as a source of frequency reference or time reference. As an example of this, there has been proposed a surface mount oscillator for an electronic card that includes, for example, a SIM (subscriber identity module) card in which a crystal piece and an IC chip are arranged in parallel in the horizontal direction.

3. Prior Art

FIG. 3 is a drawing for describing a conventional example of a surface mount oscillator, wherein FIG. 3A is a broken sectional [sectional] view, and FIG. 3B is a plan view with a metal cover removed.

A surface mount oscillator of the conventional example is such that a crystal piece 2 and an IC chip 3 are housed within a concave section of a container main body 1 with a frame wall 1b laminated on a bottom wall 1a made of a ceramic material, and a metallic cover 4 covers them to thereby seal-enclose them therein. The container main body 1 is of a sectionally concave shape, and is made of laminated ceramics having a rectangular shape in plan view. On the inner bottom surface 1d of the container main body 1, there are provided a pair of crystal retention terminals 5 and circuit terminals 6 of the IC chip 3, and on the outer bottom surface 1f thereof, there are provided mount terminals 7 that correspond to a set substrate to be equipped together with other electronic components.

Here the crystal piece 2 is of a rectangular shape in plan view, and is AT cut for example. Moreover, on both principle surfaces of the crystal piece 2, there is provided an excitation electrode 8, and lead-out electrodes 9 extends out from both sides of one lengthwise end section thereof. The both sides of the one end section of the crystal piece 2, from which the lead-out electrodes 9 extend out, are fixed to the crystal retention terminals 5 by means of an electrically conductive adhesive agent 10. The IC chip 3 has an integrated amplifier and the like that configure an oscillating circuit, and is arranged on the inner bottom surface 1d of the container main body 1 so as to be adjacent to and horizontally parallel with the crystal piece 2. Moreover, it is flip-chip bonded using bumps 11, and respective IC terminals (not shown in the drawing) provided on the circuit forming surface are electrically connected to the circuit terminals 6 provided on the inner bottom surface 1d.

The crystal terminals among the IC terminals are electrically connected to the crystal retention terminals 5, and a power supply terminal, a ground terminal, an output terminal, an AFC terminal, and the like among the IC terminals are electrically connected, via end surface electrodes 7a, which are formed by means of through-hole processing, to the mount terminals 7. The metallic cover 4 is joined onto a seam ring 12 provided on an opening end surface 1e of the container main body 1, by means of seam welding for example. The seam ring 12 is made of a metallic body or a thick metallic film.

In such a conventional surface mount oscillator, the crystal piece 2 and the IC chip 3 are arranged in parallel in the horizontal direction on the inner bottom surface 1d of the container main body 1. Therefore, it is possible to reduce the height thereof, compared to one in which the IC chip 3 is arranged under, that is to say, arranged vertically-superimposed under the lower surface of the crystal piece 2, both sides of one end section of which are fixed on an inner wall step section as shown in FIG. 4 for example. As a result, it is suitable as a surface mount oscillator to be built-in in a thin electronic device or even in an electronic card.

Incidentally, in a case where the crystal piece 2 and the IC chip 3 are arranged in parallel in the horizontal direction on the inner bottom surface 1d, the height of the container main body 1 may be approximately 0.3 mm and the thickness of the metallic cover 4 may be 70 μm; and in a case where the seam ring 12 provided on the opening end surface 1e of the container main body 1 is a metallic body (120 μm), the total height may be approximately 0.5 μm; and moreover in a case where the seam ring 12 is a thick metallic film (film thickness 10 to 20 μm), the height may be approximately 0.4 mm.

On the other hand, in a case where the crystal piece 2 and the IC chip 3 are arranged vertically superimposed, the height of the container main body 1 is 0.55 mm. Moreover, with the thickness of the seam ring 12 (metallic body: thickness 120 μm) and the metallic cover 4 (thickness 70 μm), the total height thereof is approximately 0.75 mm. Therefore, in a case where the crystal piece 2 and the IC chip 3 are arranged in parallel in the horizontal direction, the height of the entire oscillator can be reduced. (refer to Japanese Unexamined Patent Publication No. H09-83248, and Japanese Unexamined Patent Publication No. 2006-13650)

Problem in the Prior Art

However, there is a problem in the surface mount oscillator of the conventional example having the above configuration (FIG. 3A and FIG. 3B) in that while the total height of the entire oscillator can be reduced to approximately 0.5 mm or 0.4 mm by arranging the crystal piece 2 and the IC chip 3 in parallel, it is impossible to form, on the outer side surface of the container main body 1, a crystal inspection terminal (not shown in FIG. 3A and FIG. 3B) that serves as a communication terminal for inspecting the oscillation characteristics of the crystal oscillator.

That is to say, in the case where the crystal piece 2 and the IC chip 3 are arranged vertically superimposed, the height of the container main body 1 (FIG. 4) becomes approximately 0.55 mm as described above, and it is consequently possible to form, on the outer side surface of the container main-body 1, a crystal inspection terminal 13 having a height of approximately 0.3 mm and a width of approximately 0.3 mm, which are minimum dimensions in relation to a probe.

However, in a case where the crystal piece 2 and the IC chip 3 are arranged in parallel in the horizontal direction, there is a problem in that the height of the container main body 1 (FIG. 3A) becomes 0.3 mm as described above, and it is consequently impossible to form, on the outer side surface of the container main body 1, a crystal inspection terminal (not shown in FIG. 3) with minimum dimensions of 0.3 mm×0.3 mm. Therefore, when measuring the oscillation characteristics of the crystal oscillator, in general, the surface mount oscillator is inserted into a jig (not shown in the drawing) to thereby bring the tip end of a probe having an elastic mechanism into vertical contact with the crystal inspection terminal.

A similar problem occurs also in a case where the surface mount oscillator is of a temperature compensation type having a temperature compensation mechanism integrated in the IC chip, and the communication terminal is used not only as a crystal inspection terminal but also as a writing terminal for writing temperature compensation data.

Object of the Invention

An object of the present invention is to provide a surface mount oscillator in which a probe can be easily brought into contact with the communication terminal provided on the outer side surface of the container main body.

SUMMARY OF THE INVENTION

The present invention is a surface mount crystal oscillator in which a crystal piece and an IC chip are arranged in parallel and are housed within a container main body having a bottom wall and a frame wall formed with laminated ceramics, and a communication terminal is provided on an outer side surface of the container main body, wherein the configuration is such that the communication terminal is provided on a ridge section that spans from the outer side surface of the bottom wall to an outer bottom surface of the bottom wall.

EFFECT OF THE INVENTION

According to such a configuration, since the communication terminal is provided on the ridge section that spans from the outer side surface to the outer bottom surface of the bottom wall of the container main body, it is possible to bring, for example, a side surface of a probe rather than a tip end thereof into contact with the communication terminal. Therefore, the function as a communication terminal can be sufficiently demonstrated.

According to the present invention, the communication terminal is a crystal inspection terminal for inspecting oscillation characteristics of a crystal oscillator. As a result, the communication terminal can be specified as a crystal inspection terminal, and it is possible to reliably inspect the oscillation characteristics of the crystal oscillator even after a crystal piece has been seal-enclosed within the container main body in particular.

Moreover, in the present invention, the crystal piece and the IC chip are arranged in parallel on an inner bottom surface of the container main body. As a result, while reducing the height of the surface mount oscillator, it is possible to achieve the effect according to the configuration of the present invention, that is, the effect of reliably bringing the side surface of the probe into contact with the ridge section of the communication terminal.

BRIEF DESCRIPTION OF THE DRAWINGS

FIG. 1 is a drawing for describing an embodiment of a surface mount oscillator of the present invention, wherein

FIG. 2 is a sectional view taken along the line II-II in FIG. 1B (however, internal view is omitted), wherein

FIG. 3 shows a surface mount oscillator of a conventional example, wherein

DETAILED DESCRIPTION OF PREFERRED EMBODIMENT

Figure 1A:
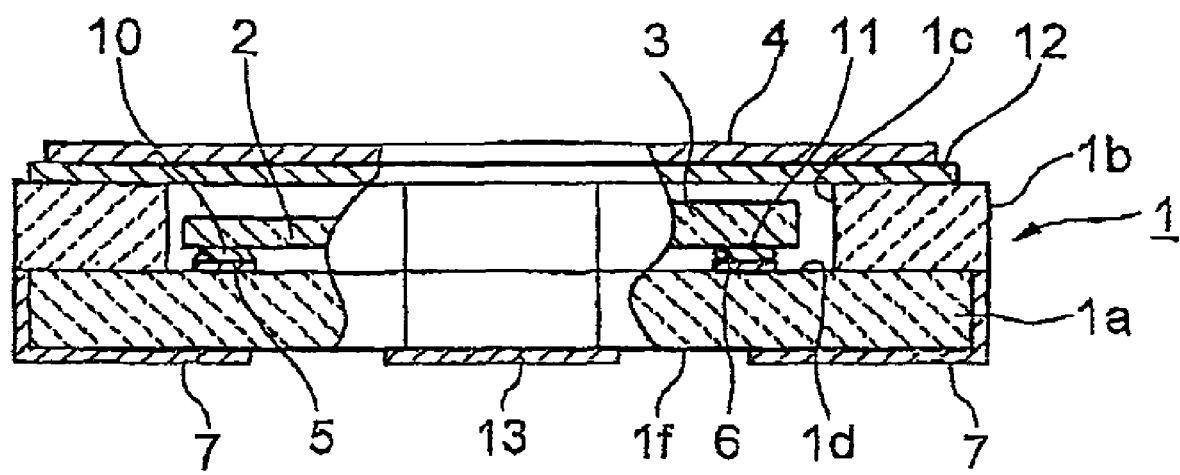
FIG. 1A is a partially cutaway sectional view taken along the line I-I in FIG. 1B.
Figure 1B:
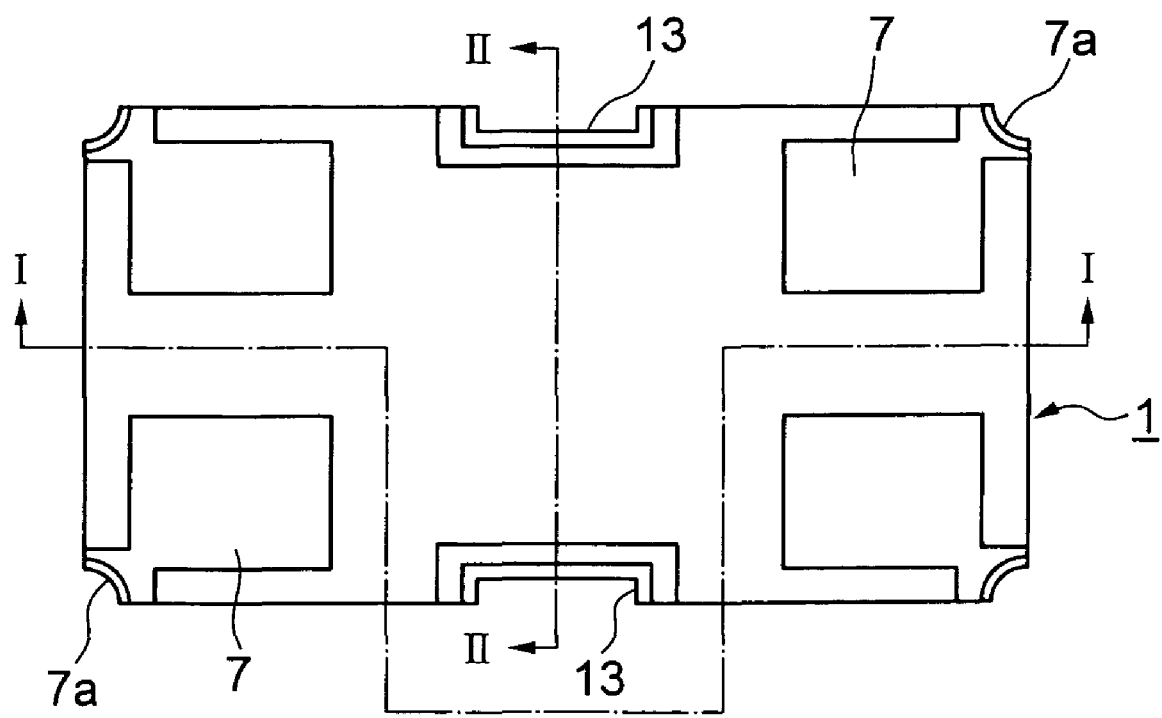
FIG. 1B is a back side view of the surface mount oscillator.

FIG. 1 is a drawing for describing an embodiment of a surface mount oscillator of the present invention, wherein FIG. 1A is a partially cutaway sectional view taken along the line I-I in FIG. 1B, FIG. 1B is a back side (bottom) view thereof.

The surface mount oscillator of the present invention is such that as shown in FIG. 1A and FIG. 1B, a crystal piece 2 and an IC chip 3 are housed within a concave section of a container main body 1 with a frame wall 1b laminated on a laminated ceramics bottom wall 1a, and a metallic cover 4 covers them to thereby seal-enclose them therein. The container main body 1 is of a sectionally concave shape, and is made of laminated ceramics having a rectangular shape in plan view. On the inner bottom surface 1d of the container main body 1, there are provided a pair of crystal retention terminals 5 and circuit terminals 6 of the IC chip 3, and on the outer bottom surface 1f thereof, there are provided mount terminals 7 to be mounted on a set substrate.

Figure 3A:
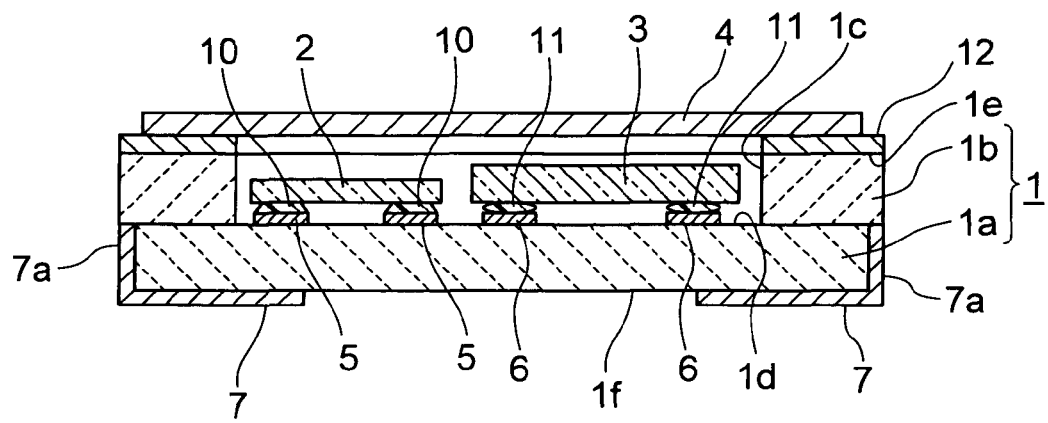
FIG. 3A is a partially cutaway sectional view taken along the line I-I in FIG. 3B.
Figure 3B:
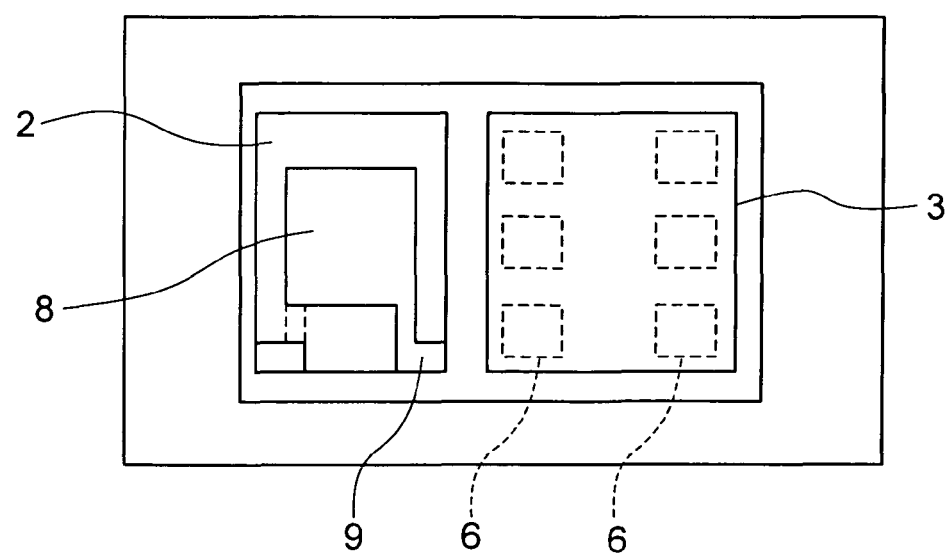
FIG. 3B is a plan view with cover removed.
Figure 4:
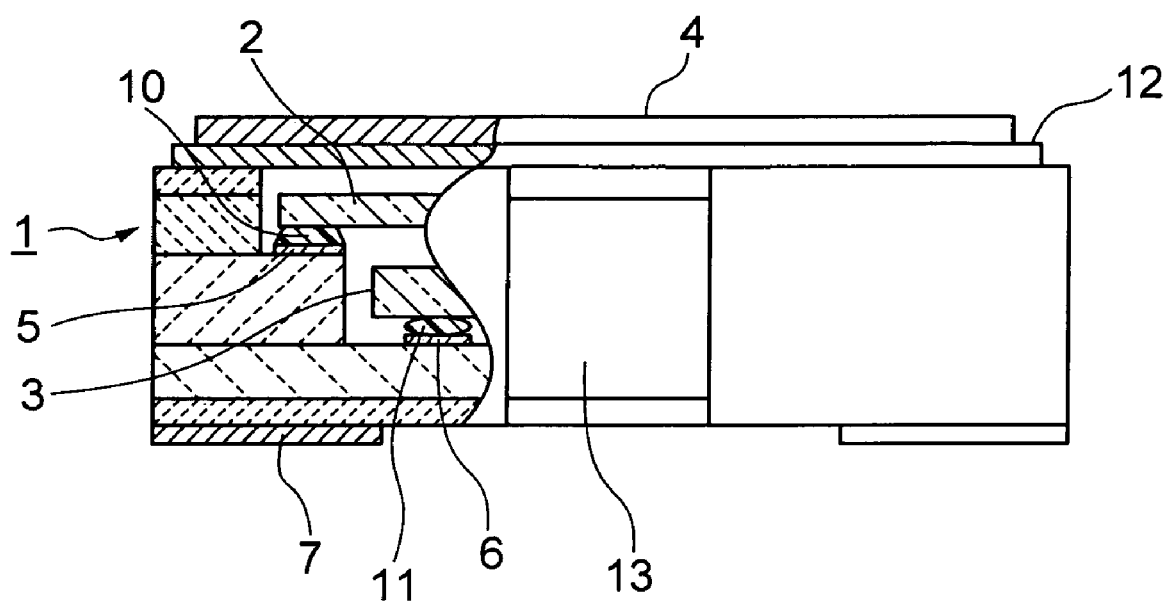
FIG. 4 is a partially cutaway sectional view showing a surface mount oscillator of another conventional example.

Here the crystal piece 2 is of a rectangular shape in plan view, and is AT cut for example. Moreover, as with the case illustrated in FIG. 3B, on both principle surfaces of the crystal piece, there is provided an excitation electrode 8, and lead-out electrodes 9 extend out from both sides of one lengthwise end section. The both sides of the one end section of the crystal piece 2, from which the lead-out electrodes 9 extend out, are fixed to the crystal retention terminals 5 by means of an electrically conductive adhesive agent 10. The IC chip 3 has an integrated amplifier and the like that configure an oscillating circuit, and is arranged on the inner bottom surface 1d of the container main body 1 so as to be adjacent to and horizontally parallel with the crystal piece 2. Moreover, it is flip-chip bonded using bumps 11, and respective IC terminals (not shown in the drawing) provided on the circuit forming surface are electrically connected to the circuit terminals 6 provided on the inner bottom surface 1d.

The crystal terminals among the IC terminals are electrically connected to the crystal retention terminals 5, and, for example, a power supply terminal, a ground terminal, an output terminal, an AFC terminal, and the like are electrically connected, via end surface electrodes 7a or the like, which are formed by means of through-hole processing, to the mount terminals 7. The metallic cover 4 is joined onto a seam ring 12 provided on an opening end surface 1e of the container main body 1, by means of seam welding for example. The seam ring 12 is made of a metallic body or a metallic film.

In this embodiment, the IC chip 3 is of a temperature compensation type and has an oscillating circuit and a temperature compensation mechanism integrated therein. In this case, with the mount terminal 7, which is provided on the bottom surface of the container main body 1 and which serves as a writing terminal, temperature compensation data is written to the temperature compensation mechanism.

Figure 2A:
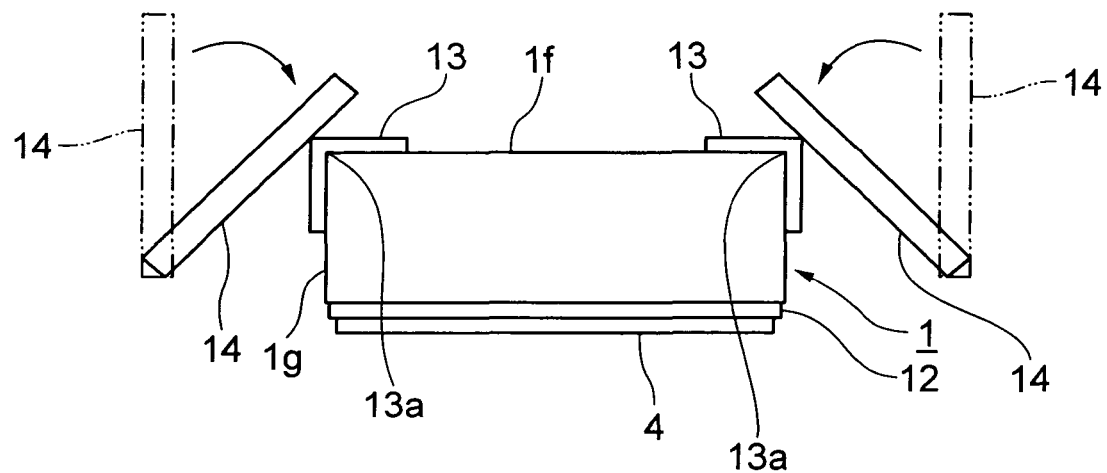
FIG. 2A is a drawing showing a state where probes are lowered and in contact with the crystal inspection terminals to thereby inspect the oscillation characteristics of a crystal oscillator.

In this embodiment, a crystal inspection terminal 13 is provided in a lengthwise central region of the container main body 1 formed between the mount terminals 7. This crystal inspection terminal 13 is only provided on the bottom wall 1a of the container main body 1, and as shown in FIG. 2A, it is provided on a ridge section 13a that spans from the outer bottom surface 1f to an outer side surface 1g of the bottom wall 1a. On the outer side surface, in which the crystal inspection terminal 13 is to be formed, there is formed a recess.

Here, first, in order to manufacture the container main body 1, a through hole is provided in an outer bottom surface of an aggregated sheet bottom wall (not shown in the drawing) for example, and W (tungsten) is coated on an outer circumferential surface of the through hole of the outer bottom surface and is flowed into the through hole by means of printing. As a result, W is thereby coated on the outer circumferential surface of the through hole provided in the outer bottom surface of the sheet bottom wall, and on an inner circumferential surface of the through hole (so-called "through hole processing). These surfaces are formed integrally with the crystal retention terminals, the mount terminals, the end surface electrodes formed by means of through hole processing, and the like.

Subsequently, in a position the same as the sheet bottom wall, a sheet frame wall having a through hole provided therein is laminated and baked on the sheet bottom wall, and then Ni (nickel) and Au (gold) are formed on the exposed W by means of electrolytic plating. Finally, the container main body formed in an aggregate form is divided into individual container main bodies 1. As a result, the recess 13a is formed in the outer side surface of the container main body 1, and on the container main body 1 there is formed the crystal inspection terminal 13 that covers the ridge section 13a that spans from the outer bottom surface to the outer side surface, which becomes the recess 13a.

In order to inspect the oscillation characteristics of the crystal oscillator, as shown in FIG. 2A, the container main body 1 configured in this way is housed within a jig (not shown in the drawing) with the front and back sides of the surface mount oscillator inverted. Then, a probe 14 in a vertical position shown with chain lines for example, that is within the jig that is connected to an oscillation characteristics measurement device, is tilted to thereby bring the side surface of the probe 14 into contact with the crystal inspection terminal 13 exposed on the ridge section 13a of the outer bottom surface of the container main body 1 as shown with the solid lines.

Figure 2B:
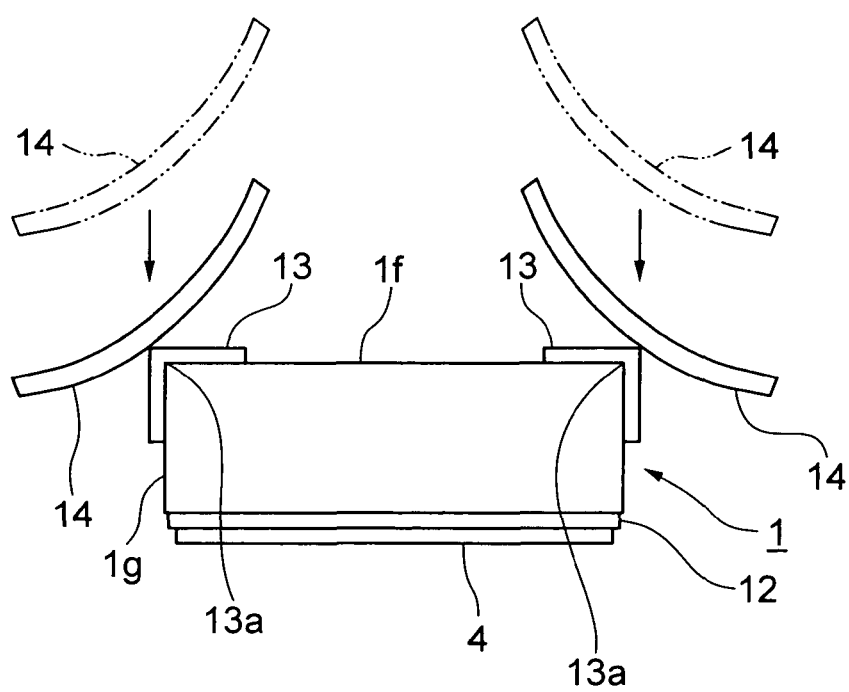
FIG. 2B is a thawing showing a state where probes are tilted and in contact with crystal inspection terminals.

Alternatively, as shown in FIG. 2B, the bent probe 14 shown in an upper area, as shown with chain lines for example, is lowered to thereby bring the probe 14 (shown with solid lines) into contact with the crystal inspection terminal 13 provided on the ridge section 13a of the container main body 1. As a result, even after the crystal piece 2 has been seal-enclosed by the metallic cover 4, it is possible to inspect the oscillation characteristics of a crystal oscillator such as crystal impedance (CI).

Here, even before joining the metallic cover 4 onto the metallic ring 12, it is of course possible, while the crystal oscillator is oscillated by means of an external oscillating circuit for example, to independently adjust the oscillation frequencies based on mass loading. In this embodiment, after the crystal oscillator has been adjusted while the crystal oscillator is being oscillated by means of the oscillating circuit of the IC chip 3 arranged within the container main body 1, the metallic cover 4 is joined onto the container main body 1, and then the oscillation characteristics of the crystal oscillator are inspected again.

In the embodiment described above, only the crystal inspection terminal 13 is provided on both of the outer side surfaces of both long direction sides of the container main body. However, for example a writing terminal may be provided on both short direction sides of the container main body 1 that are orthogonal to these. The present invention can be applied not only to a case of arranging the crystal piece 2 and the IC chip 3 in parallel, but also to a case where both of them are arranged vertically superimposed if the height of the oscillator can be sufficiently reduced. Furthermore, it is of course possible to apply the present invention also to a surface mount oscillator simply having an integrated oscillating circuit that is not of a temperature compensation type.

What is claimed is:

1. A surface mount type crystal oscillator in which a crystal piece and an IC chip are housed within a container main body having a bottom wall and a frame wall formed with laminated ceramics and first and second spaced apart mounting terminals on said bottom wall, and a crystal inspection terminal is provided on an outer side surface of said container main body, wherein said crystal inspection terminal is provided in a lengthwise central region of said container main body formed between said first and second mounting terminals and on a ridge section that spans from the outer side surface of said bottom wall to an outer bottom surface of said bottom wall.

2. A surface mount type crystal oscillator according to claim 1, wherein said crystal piece and said IC chip are arranged in parallel on an inner bottom surface of said container main body.

* * * * *